(12) United States Patent
Hara et al.

(10) Patent No.: US 10,866,404 B2
(45) Date of Patent: Dec. 15, 2020

(54) ELECTROWETTING DEVICE AND METHOD OF MANUFACTURING ELECTROWETTING DEVICE

(71) Applicant: SHARP KABUSHIKI KAISHA, Sakai (JP)

(72) Inventors: Takeshi Hara, Sakai (JP); Akihiko Shibata, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 122 days.

(21) Appl. No.: 16/087,037

(22) PCT Filed: Mar. 22, 2017

(86) PCT No.: PCT/JP2017/011522
§ 371 (c)(1),
(2) Date: Sep. 20, 2018

(87) PCT Pub. No.: WO2017/164253
PCT Pub. Date: Sep. 28, 2017

(65) Prior Publication Data
US 2019/0107709 A1   Apr. 11, 2019

(30) Foreign Application Priority Data

Mar. 24, 2016 (JP) ................. 2016-060856

(51) Int. Cl.
*G02B 26/00* (2006.01)
*B01L 3/00* (2006.01)
*H01L 27/12* (2006.01)

(52) U.S. Cl.
CPC ...... *G02B 26/005* (2013.01); *B01L 3/502707* (2013.01); *B01L 3/502792* (2013.01);
(Continued)

(58) Field of Classification Search
CPC ................. G02F 1/17; B01L 2200/027; B01L 3/502707; B01L 3/502792; G02B 26/005; G02B 26/004; G02B 26/00
(Continued)

(56) References Cited

U.S. PATENT DOCUMENTS 9,207,450 B1 * 12/2015 Manukyan ............. G09G 3/348
9,810,899 B1 * 11/2017 Slack ................... G02B 26/005
(Continued)

FOREIGN PATENT DOCUMENTS

JP    2008-052048 A    3/2008
JP    2014-052561 A    3/2014

OTHER PUBLICATIONS

Co-pending letter regarding a related application.
Non-Final Office Action dated May 28, 2020 for U.S. Appl. No. 16/141,872.

*Primary Examiner* — William R Alexander
(74) *Attorney, Agent, or Firm* — ScienBiziP, P.C.

(57) ABSTRACT

The disclosure provides an electrowetting device in which a sealing material is formed with satisfactory precision while maintaining a good adhesive property between both substrates. In a first hydrophobic layer (12) and a second hydrophobic layer (5), opening patterns (12a, 12b, 5a, and 5b) are provided, and an active substrate (7) and a common electrode substrate (2) are bonded together with a sealing material (14) provided in the opening patterns (12a, 12b, 5a, and 5b) such that a space is formed between the active substrate (7) and the common electrode substrate (2).

14 Claims, 10 Drawing Sheets

(52) U.S. Cl.
CPC . *B01L 2200/027* (2013.01); *B01L 2200/0689* (2013.01); *B01L 2300/165* (2013.01); *B01L 2400/0427* (2013.01); *H01L 27/1214* (2013.01)

(58) Field of Classification Search
USPC .......................................................... 359/290
See application file for complete search history.

(56) References Cited

U.S. PATENT DOCUMENTS

| | | |
|---|---|---|
| 10,061,117 B1* | 8/2018 | Langendijk .......... G02B 26/005 |
| 2008/0185296 A1 | 8/2008 | Sauter-Starace et al. |
| 2008/0257438 A1 | 10/2008 | Wang et al. |
| 2010/0307917 A1* | 12/2010 | Srinivasan ............ B01L 3/0268 |
| | | 204/450 |
| 2011/0140996 A1 | 6/2011 | Parry-Jones |
| 2013/0250396 A1* | 9/2013 | Kim ....................... G02B 26/02 |
| | | 359/290 |
| 2014/0036341 A1 | 2/2014 | Kwon et al. |
| 2014/0234873 A1* | 8/2014 | Leck .................... B01L 3/5088 |
| | | 435/7.92 |
| 2015/0144489 A1 | 5/2015 | Hoffmeyer et al. |
| 2015/0160452 A1 | 6/2015 | Aridomi et al. |
| 2016/0259160 A1 | 9/2016 | Hsiao et al. |
| 2018/0085756 A1* | 3/2018 | Kosaka ............. B01L 3/502746 |
| 2019/0030537 A1 | 1/2019 | Hadwen et al. |
| 2019/0094521 A1* | 3/2019 | Minari ................. G02B 26/005 |

* cited by examiner (a)

(b)

(c)

(d)

(e)

(f)

(a)

(b)

(c)

(d)

(e)

(f)

(a)

(b)

(c)

(a)

(b)

(c)

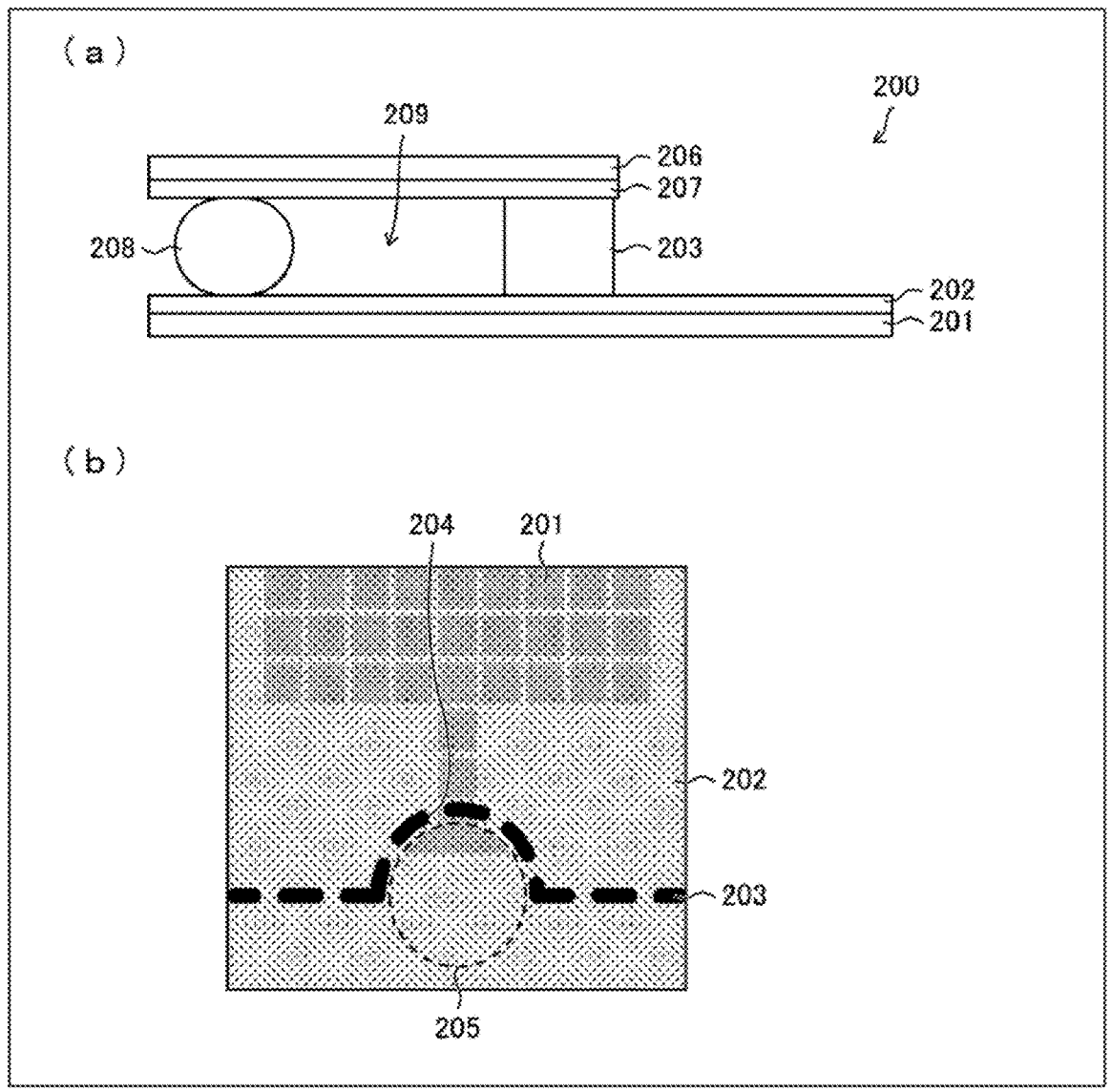

ELECTROWETTING DEVICE AND METHOD OF MANUFACTURING ELECTROWETTING DEVICE

TECHNICAL FIELD

The disclosure relates to an electrowetting device and a method for producing the electrowetting device.

BACKGROUND ART

In the field of microfluidics and the like, manipulation of fluids on a small scale (e.g., sub-microliter) and precise control are required. Under the circumstances, attention is being given to electrowetting in which a droplet is manipulated by applying an electric field.

Electrowetting is a phenomenon in which, when a voltage is applied to a droplet placed on a dielectric layer which is provided on an electrode and has been subjected to hydrophobic treatment (i.e., water-repellent treatment), surface energy of the dielectric layer changes by electrostatic energy of a capacitor that is formed between the electrode and the droplet, and thus solid-fluid interface energy changes and accordingly a contact angle of the droplet with respect to a surface of a dielectric film changes.

In recent years, development of an electrowetting device (also referred to as "microfluidic device" or "droplet device") utilizing such electrowetting is being carried out.

For example, Patent Literature 1 discloses an image display device which is an example of an electrowetting device and utilizes electrowetting.

In the image display device utilizing electrowetting, a flat part of an electrically insulating hydrophobic film provided on a lower side substrate and a flat part of an electrode layer provided on an upper side substrate are bonded together with a sealing material, and thus a display panel is provided in which the electrically insulating hydrophobic film and the electrode layer face each other inside the display panel.

CITATION LIST

Patent Literature

Patent Literature 1: Japanese Patent Application Publication Tokukai No. 2014-52561 (Publication date: Mar. 20, 2014)

SUMMARY

Technical Problem

Each of (a) through (c) of FIG. 9 is a view for explaining a problem of an electrowetting device 100 in which (i) a flat part of a hydrophobic film 104 provided on a lower side substrate 103 and a flat part of a hydrophobic film 102 provided on an upper side substrate 101 are bonded together with a sealing material 105 and (ii) a droplet 107 is to be fed from the upper side substrate 101.

(a) of FIG. 9 is a view schematically illustrating a configuration of a conventional electrowetting device 100.

(b) of FIG. 9 is a view illustrating a state in which a sealing material 105 is provided on a flat part of the hydrophobic film 102 or a flat part of the hydrophobic film 104 in the conventional electrowetting device 100.

(c) of FIG. 9 is a view schematically illustrating a configuration in the vicinity of an inlet 108 for the droplet 107 in the conventional electrowetting device 100.

As illustrated in (a) of FIG. 9, in the electrowetting device 100, a flat part of the hydrophobic film 104 provided on the lower side substrate 103 and a flat part of the hydrophobic film 102 provided on the upper side substrate 101 are bonded together with the sealing material 105 such that the hydrophobic film 104 on the lower side substrate 103 and the hydrophobic film 102 on the upper side substrate 101 face each other.

That is, in the electrowetting device 100, a flow channel for the droplet 107 is formed by the hydrophobic film 102 and the hydrophobic film 104, which face each other, while taking into consideration a moving speed of the droplet 107 and the like, and an oil 106 is fed inside the flow channel as a nonconductive liquid that is immiscible with the droplet 107.

However, in the electrowetting device 100, it is necessary to provide the sealing material 105 on one of the flat part of the hydrophobic film 102 and the flat part of the hydrophobic film 104 in order to bond the upper side substrate 101 and the lower side substrate 103 together.

In the field of electrowetting devices, an epoxy-based sealing material is generally used as the sealing material 105. This may cause a problem as follows: that is, in a case where the sealing material 105 is provided on the flat part of the hydrophobic film 102 or on the flat part of the hydrophobic film 104 as illustrated in (b) of FIG. 9, the hydrophobic film 102 or the hydrophobic film 104 repels the sealing material 105 and therefore the sealing material 105 cannot be linearly formed.

This further causes the following problem: that is, in a case where the sealing material 105 is provided on the flat part of the hydrophobic film 102 or on the flat part of the hydrophobic film 104 and thus the upper side substrate 101 and the lower side substrate 103 are bonded together, adhesive properties of a contact part between the hydrophobic film 102 and the sealing material 105 and of a contact part between the hydrophobic film 104 and the sealing material 105 are deteriorated, and the upper side substrate 101 and the lower side substrate 103 are easily detached from each other, and therefore the oil 106 inside the flow channel leaks out.

Moreover, the hydrophobic film 102 and the hydrophobic film 104 repel the sealing material 105 and the sealing material 105 cannot be linearly formed, and this prevents the sealing material 105 from being precisely formed at a predetermined location.

As illustrated in (c) of FIG. 9, in the electrowetting device 100, the sealing material 105 needs to be provided so as not to overlap with the inlet 108 for the droplet 107 (and, although not illustrated, the same applies to an outlet for discharging a gas inside the flow channel). However, as above described, the sealing material 105 cannot be formed precisely, and it is therefore necessary to sufficiently secure a distance between the inlet 108 for the droplet 107 and the sealing material 105 in consideration of a degree of unevenness in forming the sealing material 105. As a result, it becomes difficult to reduce a size of the electrowetting device 100.

Each of (a) and (b) of FIG. 10 is a view for explaining a problem of an electrowetting device 200 having a configuration in which a flat part of a hydrophobic film 202 provided on a lower side substrate 201 and a flat part of a hydrophobic film 207 provided on an upper side substrate 206 are bonded together with a sealing material 203 and a droplet 208 is to be laterally fed.

As illustrated in (a) of FIG. 10, in the electrowetting device 200, the lower side substrate 201 is larger in size than the upper side substrate 206, and a flat part of the hydrophobic film 202 provided on the lower side substrate 201 and a flat part of the hydrophobic film 207 provided on the upper side substrate 206 are bonded together with the sealing material 203 such that a part of the hydrophobic film 202 on the lower side substrate 201 and the hydrophobic film 207 on the upper side substrate 206 face each other.

That is, in the electrowetting device 200, a flow channel for the droplet 208 is formed by the hydrophobic film 202 and the hydrophobic film 207, which face each other, while taking into consideration a moving speed of the droplet 208 and the like, and an oil 209 is fed inside the flow channel as a nonconductive liquid that is immiscible with the droplet 208. Moreover, a droplet feeding region for laterally feeding the droplet 208 is provided on the hydrophobic film 202 provided on the lower side substrate 201 at a location which does not face the hydrophobic film 207 provided on the upper side substrate 206.

In the electrowetting device 200 also, as with the above described electrowetting device 100, the following problem occurs: that is, adhesive properties of a contact part between the hydrophobic film 202 and the sealing material 203 and of a contact part between the hydrophobic film 207 and the sealing material 203 are deteriorated, the lower side substrate 201 and the upper side substrate 206 are easily detached from each other, and therefore the oil 209 inside the flow channel leaks out.

Moreover, in the electrowetting device 200 having the configuration in which the droplet 208 is laterally fed, the droplet 208 is to be fed into the flow channel from the outside, and it is therefore necessary to precisely provide openings 204 (i.e., missing parts) in the sealing material 203 on an electrode layer that is formed from the droplet feeding region 205 on the lower side substrate 201, as illustrated in (b) of FIG. 10.

However, the hydrophobic film 202 and the hydrophobic film 207 repel the sealing material 203, and this prevents the sealing material 203 from being precisely formed at a predetermined location. This causes the following problem: that is, the openings 204 (i.e., missing parts) of the sealing material 203 cannot be precisely provided in the electrowetting device 200 as illustrated in (b) of FIG. 10, and therefore a path through which the droplet 208 fed from the outside flows is partially or wholly blocked by the sealing material 203.

Patent Literature 1 discloses an image display device which utilizes electrowetting and in which a flat part of an electrically insulating hydrophobic film that is provided on a lower side substrate and a flat part of an electrode layer that is provided on an upper side substrate are bonded together with a sealing material.

In the image display device, only the electrically insulating hydrophobic film provided on the lower side substrate is a hydrophobic film, and this point is a difference from the electrowetting device 100 illustrated in FIG. 9 and the electrowetting device 200 illustrated in FIG. 10 in each of which hydrophobic films are provided on both the substrates. Meanwhile, the image display device is common to the electrowetting device 100 of FIG. 9 and the electrowetting device 200 of FIG. 10 in that a part which makes contact with the sealing material is a flat part.

From those, in the image display device disclosed in Patent Literature 1, the adhesive property of the contact part between the sealing material and the electrode layer which is provided on the upper side substrate is improved, and it is therefore possible to expect improvement in peel strength between the upper side substrate and the lower side substrate. However, the part in contact with the sealing material, i.e., the electrically insulating hydrophobic film provided on the lower side substrate and the electrode layer provided on the upper side substrate are not provided with any structural mechanism for controlling expansion of the sealing material, and it is therefore impossible to form the sealing material with satisfactory precision.

The disclosure is accomplished in view of the problem, and its object is to provide an electrowetting device in which a sealing material is formed with satisfactory precision while maintaining a good adhesive property between both substrates, and to provide a method for producing such an electrowetting device.

Solution to Problem

In order to attain the object, an electrowetting device of the disclosure includes: an active substrate including a first substrate, a first electrode layer provided on the first substrate, a dielectric layer provided so as to cover the first electrode layer, and a first hydrophobic layer which has surface tension smaller than that of the dielectric layer and is provided on the dielectric layer; and a common electrode substrate including a second substrate, a second electrode layer provided on the second substrate, and a second hydrophobic layer which has surface tension smaller than that of the second electrode layer and is provided on the second electrode layer, an opening pattern being provided in at least one of the first hydrophobic layer and the second hydrophobic layer, and the active substrate and the common electrode substrate being bonded together with a sealing material in the opening pattern such that a space is formed between the active substrate and the common electrode substrate and the first hydrophobic layer and the second hydrophobic layer face each other.

According to the configuration, an opening pattern is provided in at least one of the first hydrophobic layer and the second hydrophobic layer and the sealing material is provided in the opening pattern. Therefore, the opening pattern serves as a structural mechanism for controlling expansion of the sealing material, and this makes it possible to form the sealing material with satisfactory precision.

Moreover, according to the configuration, at least one of the layers in contact with the sealing material is the dielectric layer having surface tension greater than that of the first hydrophobic layer or is the second electrode layer having surface tension greater than that of the second hydrophobic layer. From this, it is possible to maintain a good adhesive property between the active substrate and the common electrode substrate which are bonded together. That is, it is possible to maintain good peel strength between the active substrate and the common electrode substrate which are bonded together.

In order to attain the object, a method of the disclosure for producing an electrowetting device includes: an active substrate forming step including forming a first electrode layer on a first substrate, forming a dielectric layer which covers the first electrode layer, and forming a first hydrophobic layer, which has surface tension smaller than that of the dielectric layer, on the dielectric layer; a common electrode substrate forming step including forming a second electrode layer on a second substrate, and forming a second hydrophobic layer, which has surface tension smaller than that of the second electrode layer, on the second electrode layer; and a bonding step of bonding the active substrate and the common electrode substrate together with a sealing material such that a space is formed between the active substrate and the common electrode substrate and the first hydrophobic layer and the second hydrophobic layer face each other, at least one of the forming the first hydrophobic layer on the dielectric layer and the forming the second hydrophobic layer on the second electrode layer including an opening pattern forming step of forming an opening pattern in the hydrophobic layer, and in the bonding step, the sealing material being formed in the opening pattern.

According to the method, at least one of the forming the first hydrophobic layer on the dielectric layer and the forming the second hydrophobic layer on the second electrode layer includes the opening pattern forming step of forming an opening pattern in the hydrophobic layer and, in the bonding step, the sealing material is formed in the opening pattern. Therefore, the opening pattern serves as a structural mechanism for controlling expansion of the sealing material, and this makes it possible to form the sealing material with satisfactory precision.

Moreover, according to the method, at least one of the layers in contact with the sealing material is the dielectric layer having surface tension greater than that of the first hydrophobic layer or the second electrode layer having surface tension greater than that of the second hydrophobic layer. From this, it is possible to maintain a good adhesive property between the active substrate and the common electrode substrate which are bonded together. That is, it is possible to maintain good peel strength between the active substrate and the common electrode substrate which are bonded together.

Advantageous Effects of Invention

According to an aspect of the disclosure, it is possible to provide the electrowetting device in which a sealing material is formed with satisfactory precision while maintaining a good adhesive property between both substrates, and to provide the method for producing such an electrowetting device.

BRIEF DESCRIPTION OF DRAWINGS

FIG. 10 is a view for explaining a problem of a conventional electrowetting device employing a mechanism in which a droplet is laterally fed.

DESCRIPTION OF EMBODIMENTS

Figure 1:
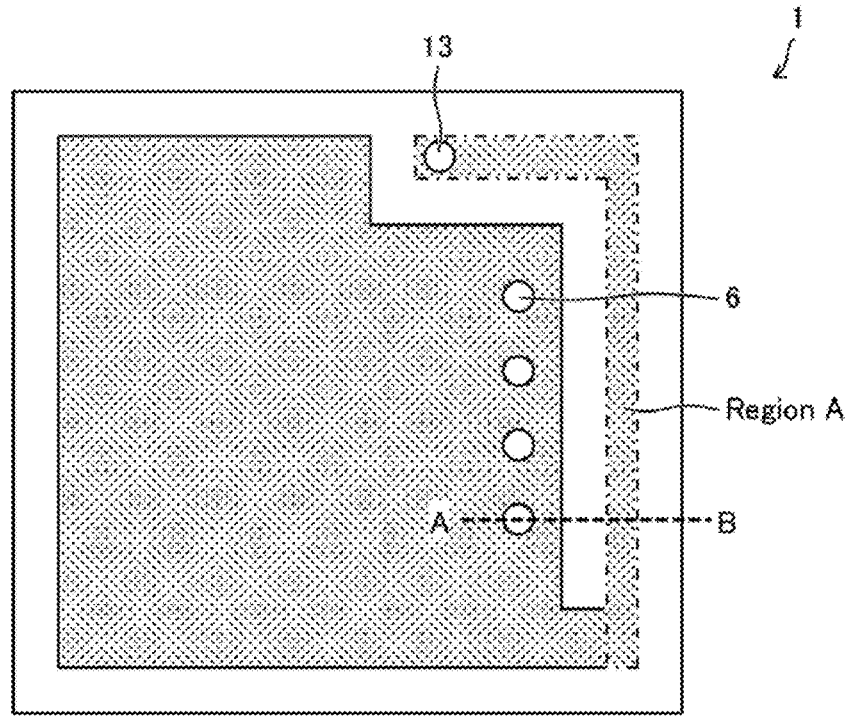
FIG. 1 is a view schematically illustrating a configuration of an electrowetting device in accordance with Embodiment 1 of the disclosure in which substrates have not been bonded together with a sealing material yet.
Figure 1:
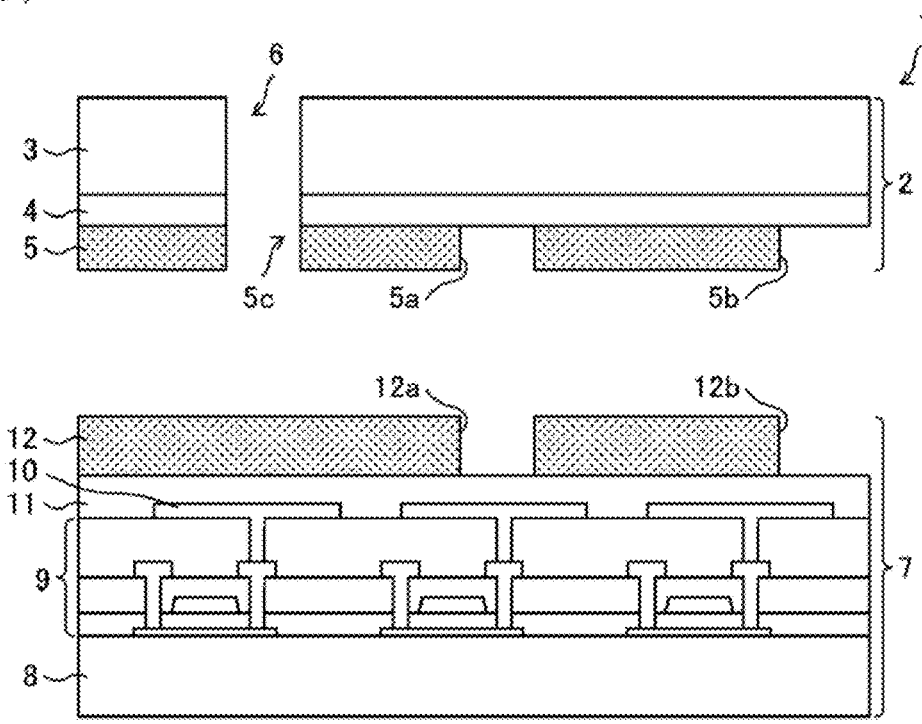

The following description will discuss embodiments of the disclosure with reference to FIGS. 1 through 8. Hereinafter, for convenience of explanation, the same reference numerals are given to constituent members which have functions identical with those described in a particular embodiment, and descriptions regarding such constituent members may be omitted.

Embodiment 1

In Embodiment 1, an active matrix electrowetting-on-dielectric (AM-EWOD) device will be described as an electrowetting device of Embodiment 1, in which droplet driving (electrowetting-on-dielectric; EWOD) is carried out in an active matrix arrangement of thin film transistors (TFT).

(a) of FIG. 1 is a view illustrating an electrowetting device 1 which is seen from a common electrode substrate side and in which substrates have not been bonded together with use of a sealing material yet. (b) of FIG. 1 is a cross-sectional view taken along the line A-B in (a) of FIG. 1 and schematically illustrates a configuration of the electrowetting device 1.

As illustrated in (a) of FIG. 1, the common electrode substrate 2 is provided with a plurality of through holes. One or some of the plurality of through holes respectively serve as inlets 6 through which droplets are fed, and at least one of the rest of the plurality of through holes serves as an outlet 13 through which a gas is discharged.

In Embodiment 1, five through holes in total are provided in the common electrode substrate 2, four of those through holes are configured to serve as inlets 6 through which a droplet or an oil as a nonconductive liquid is fed, and the remaining one of those through holes is configured to serve as an outlet 13 through which a gas is discharged. Note, however, that Embodiment 1 is not limited to this, and the number of through holes to be provided, the number of inlets 6, and the number of outlets 13 can of course be changed as appropriate.

Note that a region indicated by a dot pattern in (a) of FIG. 1 is a region in which at least one of a first hydrophobic layer 12 and a second hydrophobic layer 5 is provided when the electrowetting device 1 is seen from the common electrode substrate 2 side. A shape of the region may of course vary depending on positions of and the number of inlets 6 and outlets 13 which are provided in the common electrode substrate 2.

In the electrowetting device 1, a flow channel for a droplet is formed by the first hydrophobic layer 12 and the second hydrophobic layer 5 which face each other in consideration of a moving speed of a droplet which is fed through the inlet 6, and the like. In the flow channel, an oil which is a nonconductive liquid immiscible with the droplet is fed before the droplet is fed through the inlet 6.

The electrowetting device 1 having such a configuration is provided with (i) a space (in FIG. 1, region A surrounded by dashed dotted lines) for holding an oil that has been expelled by a volume corresponding to a droplet that is fed through the inlet 6 and (ii) the outlet 13 (i.e., air vent) through which a gas in the space is discharged.

As illustrated in (b) of FIG. 1, the active substrate 7 includes a first substrate 8, a thin film transistor (TFT) formation layer 9 provided on the first substrate 8, a first electrode layer 10 which is provided on the thin film transistor (TFT) formation layer 9 and constitutes first electrodes which are electrically connected with respective drain electrodes of thin film transistors in the thin film transistor (TFT) formation layer 9, a dielectric layer 11 provided so as to cover the first electrode layer 10, and a first hydrophobic layer 12 which is provided on the dielectric layer 11 and has surface tension smaller than that of the dielectric layer 11.

The first electrodes are active matrix (AM) electrodes, and are arranged on the thin film transistor (TFT) formation layer 9 in an array of M×N (where each of M and N is an arbitrary number).

The dielectric layer 11 is provided on the thin film transistor (TFT) formation layer 9 and the first electrode layer 10 so as to cover the plurality of first electrodes, and separates the first electrode layer 10 from the first hydrophobic layer 12.

Meanwhile, the common electrode substrate 2 includes a second substrate 3, a second electrode layer 4 which is provided on the second substrate 3 and serves as a common electrode layer, and a second hydrophobic layer which has surface tension smaller than that of the second electrode layer 4 and is provided on the second electrode layer 4.

Note that, in Embodiment 1, the second hydrophobic layer 5 in the common electrode substrate 2 is formed as follows: that is, a 1 wt % diluted solution of "CYTOP (Registered Trademark)-CTL107MK" (product name) which is a perfluoro amorphous resin manufactured by AGC Asahi Glass Co., Ltd. is formed into a layer on the second electrode layer 4 by a spin coating method, and then opening patterns 5a and 5b are formed in the layer by a later-described patterning method. However, the second hydrophobic layer 5 is not limited to this and, for example, the second hydrophobic layer 5 can be formed on the second electrode layer 4 by a slit coating method or a dip coating method. In a case where the dip coating method is employed, the entire second substrate 3 on which the second electrode layer 4 is provided can be immersed in a 1 wt % diluted solution of "CYTOP (Registered Trademark)-CTL107MK" (product name).

Moreover, in Embodiment 1, the first hydrophobic layer 12 in the active substrate 7 is formed as follows: that is, a 1 wt % diluted solution of "CYTOP (Registered Trademark)-CTL107MK" (product name) which is a perfluoro amorphous resin manufactured by AGC Asahi Glass Co., Ltd. is formed into a layer on the dielectric layer 11 by a spin coating method, and then opening patterns 12a and 12b are formed in the layer by a later-described patterning method. However, the first hydrophobic layer 12 is not limited to this and, for example, the first hydrophobic layer 12 can be formed on the dielectric layer 11 by a slit coating method or a dip coating method. In a case where the dip coating method is employed, the entire first substrate 8 on which the dielectric layer 11 is provided can be immersed in a 1 wt % diluted solution of "CYTOP (Registered Trademark)-CTL107MK" (product name).

Note that, in Embodiment 1, the first hydrophobic layer 12 and the second hydrophobic layer 5 are formed by the spin coating method. Therefore, film thicknesses of the first hydrophobic layer 12 and the second hydrophobic layer 5 can be adjusted as appropriate by adjusting the degree of dilution of "CYTOP (Registered Trademark)-CTL107MK" (product name) and the number of rotations per minute (rpm) of a spin coater as appropriate.

Each of the opening patterns 12a and 12b in the first hydrophobic layer 12 and the opening patterns 5a and 5b in the second hydrophobic layer 5 is an opening pattern for providing the sealing material. The opening pattern 12a in the first hydrophobic layer 12 is provided so as to overlap with the opening pattern 5a in the second hydrophobic layer 5 in the plan view, and the opening pattern 12b in the first hydrophobic layer 12 is provided so as to overlap with the opening pattern 5b in the second hydrophobic layer 5 in the plan view.

In particular, the opening pattern 12a in the first hydrophobic layer 12 and the opening pattern 5a in the second hydrophobic layer 5 are provided in order to form a space for holding an oil which has been expelled by a volume corresponding to a droplet that is fed through the inlet 6, and the opening pattern 12b in the first hydrophobic layer 12 and the opening pattern 5b in the second hydrophobic layer 5 are formed for boding peripheral edges together.

Figure 2:
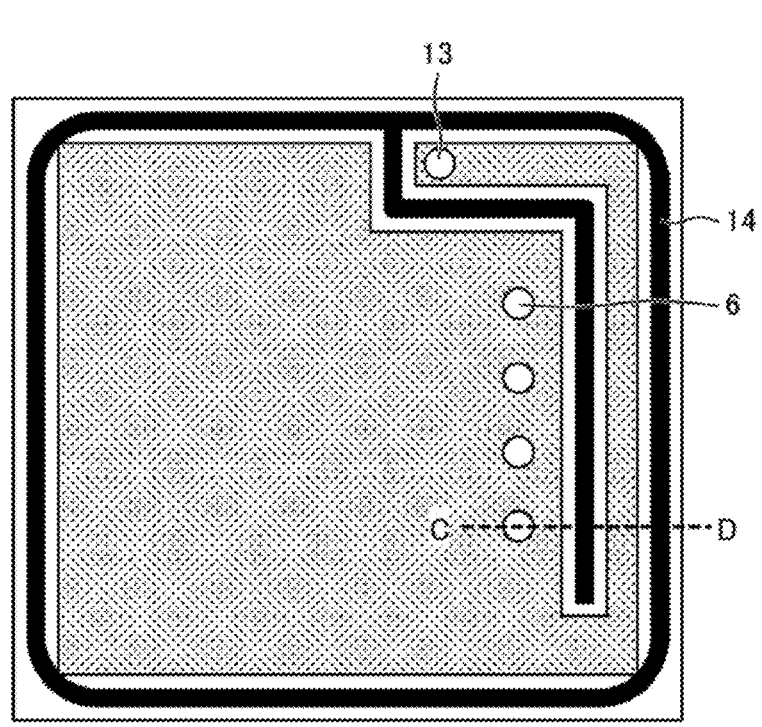
FIG. 2 is a view schematically illustrating a configuration of the electrowetting device in accordance with Embodiment 1 of the disclosure in which substrates have been bonded together with a sealing material.
Figure 2:
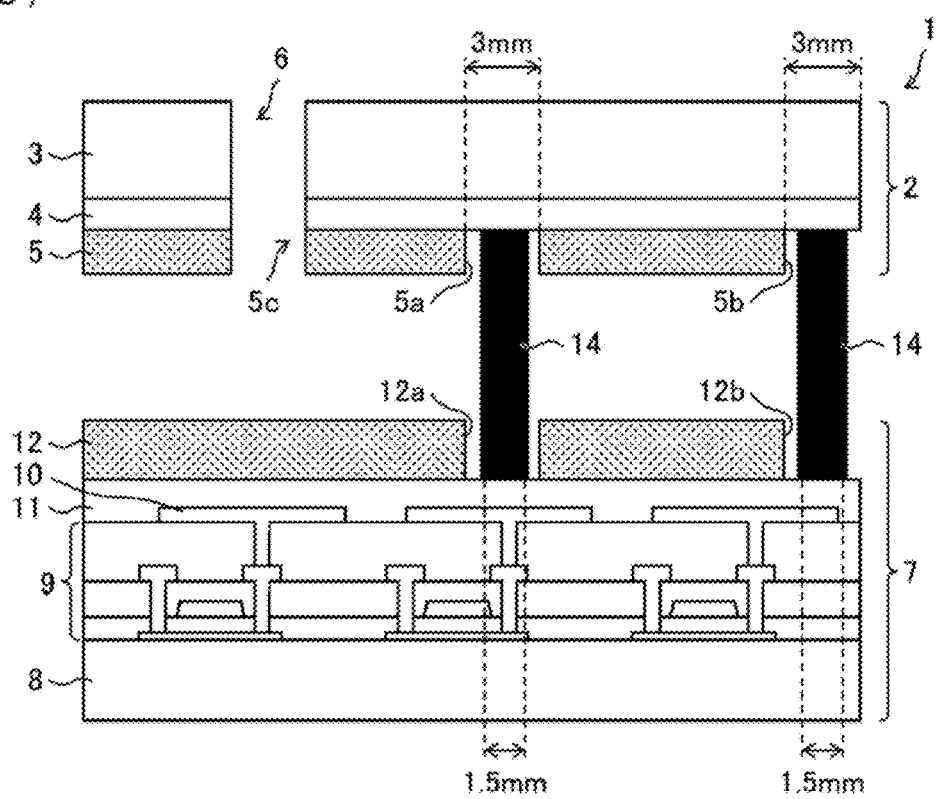

(a) of FIG. 2 is a view illustrating the electrowetting device 1 which is seen from the common electrode substrate 2 side and in which substrates have been bonded together with use of the sealing material 14. (b) of FIG. 2 is a cross-sectional view taken along the line C-D in (a) of FIG. 2 and schematically illustrates a configuration of the electrowetting device 1.

As illustrated in (a) and (b) of FIG. 2, the sealing material 14 is provided in the opening patterns 12a and 12b in the first hydrophobic layer 12 and in the opening patterns 5a and 5b in the second hydrophobic layer 5, and the common electrode substrate 2 and the active substrate 7 are bonded together with the sealing material 14.

In Embodiment 1, in order for the sealing material 14 to be is provided so as not to make contact with both lateral surfaces in the opening patterns 12a and 12b in the first hydrophobic layer 12 and in the opening patterns 5a and 5b in the second hydrophobic layer 5, (i) each of the opening patterns 12a and 12b and the opening patterns 5a and 5b is formed so as to have a width of 3 mm, (ii) viscosity of the sealing material 14 is adjusted to become relatively high, and (iii) a predetermined width of the sealing material 14 is placed along middle portions in the opening patterns 12a and 12b and the opening patterns 5a and 5b as illustrated in (a) of FIG. 2 such that the width of the sealing material 14 becomes 1.5 mm after the substrates are bonded together. According to the arrangement, the sealing material 14 is away from the both lateral surfaces of the opening patterns 12a and 12b and the opening patterns 5a and 5b by 0.75 mm.

Note that the widths of the respective opening patterns 12a and 12b and opening patterns 5a and 5b and the width of the sealing material 14 can of course be changed as appropriate according to need, and the widths of the respective opening patterns 12a, 12b, 5a, and 5b can be different from each other.

In Embodiment 1, the sealing material 14 is provided not only in the opening patterns 12a and 12b in the first hydrophobic layer 12 in the active substrate 7 but also in the opening patterns 5a and 5b in the second hydrophobic layer 5 in the common electrode substrate 2. Embodiment 1 is not limited to this, and the common electrode substrate 2 and the active substrate 7 can be bonded together with the sealing material 14 which is provided in the opening patterns 12a and 12b in the first hydrophobic layer 12 in the active substrate 7, or the common electrode substrate 2 and the active substrate 7 can be bonded together with the sealing material 14 which is provided in the opening patterns 5a and 5b in the second hydrophobic layer 5 in the common electrode substrate 2.

Note that Embodiment 1 is still not limited to the above described arrangements, provided that the sealing material 14 is provided on at least one of the common electrode substrate 2 and the active substrate 7 and the common electrode substrate 2 and the active substrate 7 are bonded together with the sealing material 14.

Note that, in Embodiment 1, the epoxy-based sealing material which is a sealing material containing an epoxy group is used as the sealing material 14, the dielectric layer 11 has surface tension greater than that of the first hydrophobic layer 12, and the second electrode layer 4 has surface tension greater than that of the second hydrophobic layer 5. Therefore, the sealing material 14 is repelled by the first hydrophobic layer 12 and the second hydrophobic layer 5. Meanwhile, the sealing material 14 is not repelled by the dielectric layer 11 which is exposed in the opening patterns 12a and 12b in the first hydrophobic layer 12 and by the second electrode layer 4 which is exposed in the opening patterns 5a and 5b in the second hydrophobic layer 5.

That is, a contact angle between the sealing material 14 and the dielectric layer 11 made of SiN (silicon nitride) or the second electrode layer 4 made of ITO (indium tin oxide) is smaller than a contact angle between the sealing material 14 and the first hydrophobic layer 12 or the second hydrophobic layer 5.

According to need, a spacer or the like can be used in order to secure a space between the common electrode substrate 2 and the active substrate 7, and such a spacer can be included in the sealing material 14.

Note that, as illustrated in (b) of FIG. 1 and (b) of FIG. 2, an opening pattern is provided in the second electrode layer 4 at a location overlapping with the inlet 6 in the plan view, and also an opening pattern 5c is provided in the second hydrophobic layer 5.

In the electrowetting device 1, a droplet fed through the inlet 6 is fed into a space between the common electrode substrate 2 and the active substrate 7, that is, a very small flow channel (micro flow channel) that is formed by a space between the second hydrophobic layer 5 of the common electrode substrate 2 and the first hydrophobic layer 12 of the active substrate 7.

As the droplet, an electroconductive liquid such as an ionic liquid or a polar liquid is used, and it is possible to use, for example, a liquid such as water, an electrolytic solution (which is an aqueous solution of electrolyte), alcohols, or various kinds of ionic liquids. Examples of the droplet encompass a whole blood sample, a bacterial cell suspension, a solution of protein or antibody, various buffer solutions, and the like.

Into the micro flow channel, an oil can be fed as a nonconductive liquid which is immiscible with the droplet. For example, in the micro flow channel, a volume which is not occupied by the droplet may be filled with the oil.

Note that the nonconductive liquid can be a nonpolar liquid (nonionic liquid) having surface tension smaller than that of the droplet. Examples of the nonconductive liquid encompass hydrocarbon-based solvents (low-molecular-hydrocarbon-based solvents) such as decane, dodecane, hexadecane, and undecane, oils such as a silicone oil, and fluorocarbon-based solvents. The silicone oil can be dimethylpolysiloxane, or the like. Note that it is possible to use only one kind of nonconductive liquid, or it is possible to use a mixture of some kinds of nonconductive liquids as appropriate.

In the electrowetting device 1, to the droplet fed into the space between the common electrode substrate 2 and the active substrate 7, that is, the micro flow channel that is formed by the space between the second hydrophobic layer 5 of the common electrode substrate 2 and the first hydrophobic layer 12 of the active substrate 7, a predetermined voltage is applied by the first electrode layer 10 of the active substrate 7 in a predetermined sequence via first electrodes (active matrix (AM) electrodes) which are arranged in an array in the thin film transistor (TFT) formation layer 9.

From this, a part (which is a predetermined amount of smaller droplet) is torn off (separated) from the droplet, and is then carried to a predetermined flow channel.

<Method for Producing Electrowetting Device 1>

Although not illustrated, a method for producing the electrowetting device 1 includes (i) an active substrate 7 forming step including forming a thin film transistor (TFT) formation layer 9 on a first substrate 8, forming a first electrode layer 10 on the thin film transistor (TFT) formation layer 9, forming a dielectric layer 11 which covers the first electrode layer 10, and forming a first hydrophobic layer 12, which has surface tension smaller than that of the dielectric layer 11, on the dielectric layer 11; (ii) a common electrode substrate 2 forming step including forming a second electrode layer 4 on a second substrate 3, and forming a second hydrophobic layer 5, which has surface tension smaller than that of the second electrode layer 4, on the second electrode layer 4; and (iii) a bonding step of bonding the active substrate 7 and the common electrode substrate 2 together with a sealing material 14 such that a space is formed between the active substrate 7 and the common electrode substrate 2 and the first hydrophobic layer 12 and the second hydrophobic layer 5 face each other.

Figure 3:
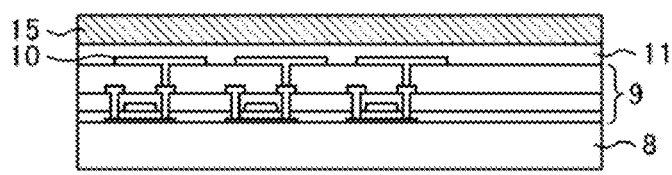
FIG. 3 is a view illustrating some steps in an example method for producing the electrowetting device in accordance with Embodiment 1 of the disclosure.
Figure 3:
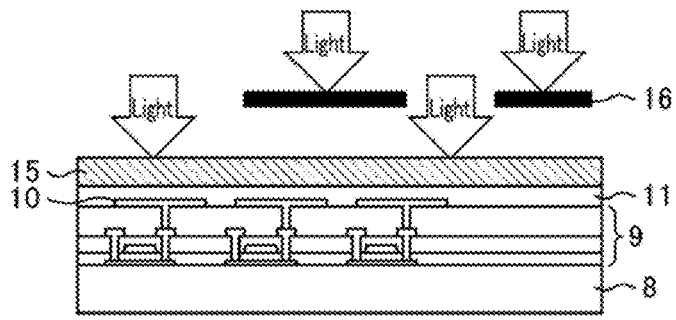
Figure 3:
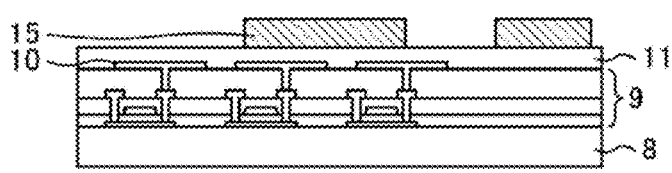
Figure 3:
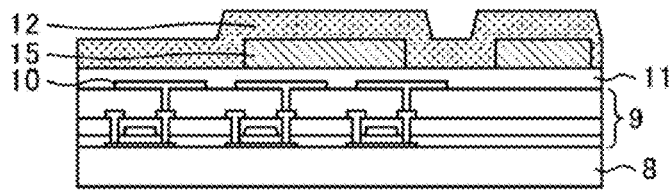
Figure 3:
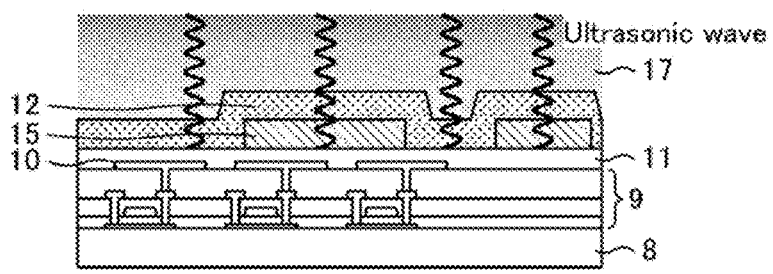
Figure 3:
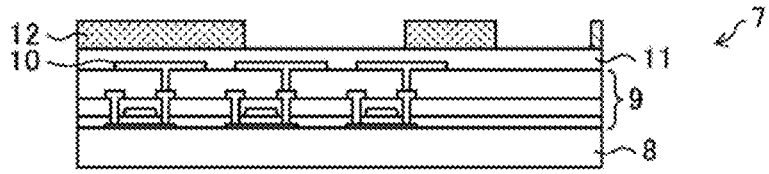

FIG. 3 is a view illustrating an example step of forming the first hydrophobic layer 12, having an opening pattern, on the dielectric layer 11 in the active substrate 7 forming step.

First, as illustrated in (a) of FIG. 3, a positive-type resist film 15 is formed on the dielectric layer 11 with use of a spin coating method, a slit coating method, a dip coating method, or the like.

Then, as illustrated in (b) of FIG. 3, only a predetermined region of the positive-type resist film 15 is exposed to light through an opening of the mask 16.

Then, as illustrated in (c) of FIG. 3, only the predetermined region of the positive-type resist film 15 which has been exposed to light is removed by carrying out development.

Then, as illustrated in (d) of FIG. 3, a 1 wt % diluted solution of "CYTOP (Registered Trademark)-CTL107MK" (product name) which is a perfluoro amorphous resin manufactured by AGC Asahi Glass Co., Ltd. is applied to the dielectric layer 11 and the positive-type resist film 15, and thus the first hydrophobic layer 12 is formed. Then, as illustrated in (e) of FIG. 3, the positive-type resist film 15 and the first hydrophobic layer 12 which has been formed on the positive-type resist film 15 are removed (i.e., lifted off) by using a removing solution 17, and this makes it possible to form the first hydrophobic layer 12, which has the opening pattern, on the dielectric layer 11 as illustrated in (f) of FIG. 3.

Note that, as illustrated in (e) of FIG. 3, by applying an ultrasonic wave when the positive-type resist film 15 and the first hydrophobic layer 12 formed on the positive-type resist film 15 are removed with use of the removing solution 17, it is possible to shorten the time required to remove the positive-type resist film 15 and the first hydrophobic layer 12 which has been formed on the positive-type resist film 15.

As above, the example has been described in which the positive-type resist film 15 is used. Note, however, that the disclosure is not limited to this, and it is possible to use a negative-type resist film.

Figure 4:
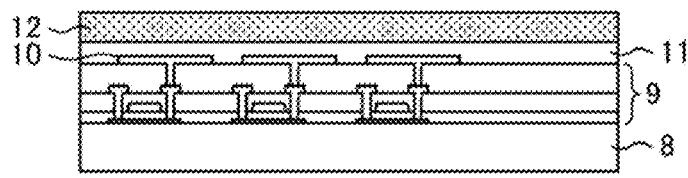
FIG. 4 is a view illustrating some steps in another example method for producing the electrowetting device in accordance with Embodiment 1 of the disclosure.
Figure 4:
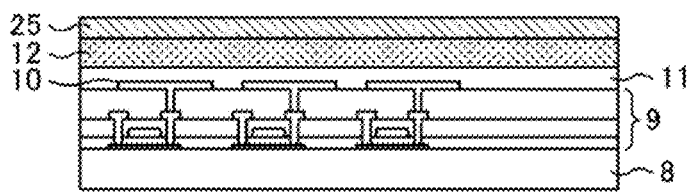
Figure 4:
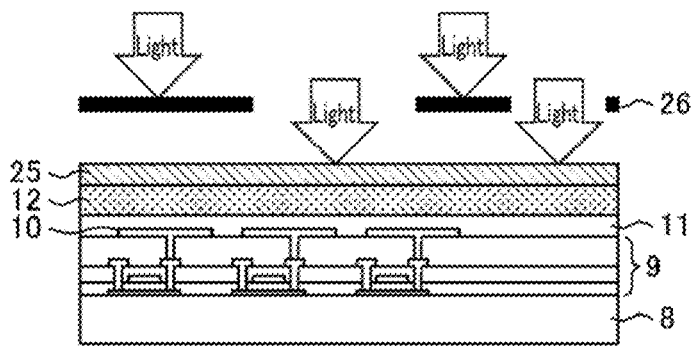
Figure 4:
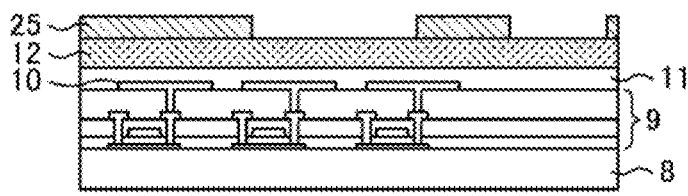
Figure 4:
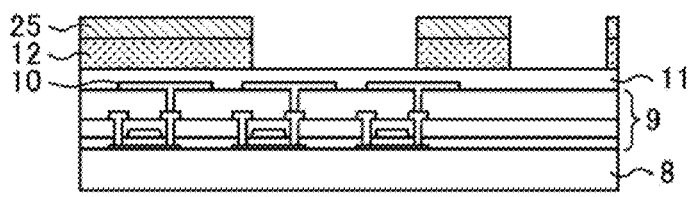
Figure 4:
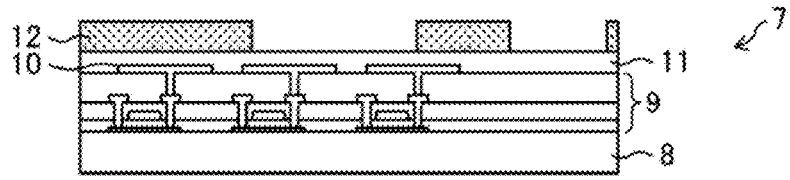

FIG. 4 is a view illustrating another example step of forming the first hydrophobic layer 12, having an opening pattern, on the dielectric layer 11 in the active substrate 7 forming step.

First, as illustrated in (a) of FIG. 4, a 1 wt % diluted solution of "CYTOP (Registered Trademark)-CTL107MK" (product name) which is a perfluoro amorphous resin manufactured by AGC Asahi Glass Co., Ltd. is applied to the dielectric layer 11, and thus the first hydrophobic layer 12 is formed.

Then, as illustrated in (b) of FIG. 4, a positive-type resist film 25 is formed on the first hydrophobic layer 12 with use of a spin coating method, a slit coating method, a dip coating method, or the like.

Then, as illustrated in (c) of FIG. 4, only a predetermined region of the positive-type resist film 25 is exposed to light through an opening of a mask 26.

Then, as illustrated in (d) of FIG. 4, only the predetermined region of the positive-type resist film 25 which has been exposed to light is removed by carrying out development.

Then, as illustrated in (e) of FIG. 4, dry etching is carried out while using the positive-type resist film 25 as a mask so as to remove the first hydrophobic layer 12 in a region in which the positive-type resist film 25 does not exist, and this makes it possible to form the first hydrophobic layer 12, which has the opening pattern, on the dielectric layer 11 as illustrated in (f) of FIG. 4.

As above, the example has been described in which the positive-type resist film 25 is used. Note, however, that the disclosure is not limited to this, and it is possible to use a negative-type resist film.

Note that, although not illustrated, the second hydrophobic layer 5 having the opening pattern can be formed on the second electrode layer 4 in the common electrode substrate 2 forming step by employing steps similar to those illustrated in FIG. 3 or FIG. 4.

In the bonding step, specifically, when the first hydrophobic layer 12 is formed on the dielectric layer 11 and when the second hydrophobic layer 5 is formed on the second electrode layer 4, the sealing material 14 is formed in the opening patterns 12a and 12b which have been formed in the first hydrophobic layer 12 and in the opening patterns 5a and 5b which have been formed in the second hydrophobic layer 5, and the active substrate 7 and the common electrode substrate 2 are bonded together with the sealing material 14 such that a space is formed between the active substrate 7 and the common electrode substrate and the first hydrophobic layer 12 and the second hydrophobic layer 5 face each other.

In Embodiment 1, the example has been described in which the opening patterns are formed in both the first hydrophobic layer 12 and the second hydrophobic layer 5. Note, however, that Embodiment 1 is not limited to this, and it is possible that an opening pattern is formed only in one of the first hydrophobic layer 12 and the second hydrophobic layer 5.

In Embodiment 1, the example has been described in which the opening pattern 12a in the first hydrophobic layer 12 is provided so as to overlap with the opening pattern 5a in the second hydrophobic layer 5 in the plan view, and the opening pattern 12b in the first hydrophobic layer 12 is provided so as to overlap with the opening pattern 5b in the second hydrophobic layer 5 in the plan view. Note, however, that those patterns may only partially overlap with each other or, further, those patterns do not need to overlap with each other.

This is because, even in a configuration in which an opening pattern is formed in only one of the first hydrophobic layer 12 and the second hydrophobic layer 5, the opening pattern serves as a structural mechanism for controlling expansion of the sealing material 14 and it is therefore possible to form the sealing material 14 with satisfactory precision, and a layer which is to be in contact with the sealing material 14 is the dielectric layer 11 having surface tension greater than that of the first hydrophobic layer 12 or the second electrode layer 4 having surface tension greater than that of the second hydrophobic layer 5 and it is therefore possible to maintain a good adhesive property between the active substrate 7 and the common electrode substrate 2 which are bonded together.

Moreover, according to Embodiment 1, the sealing material 14 is precisely arranged along the opening patterns 12a, 12b, 5a, and 5b, and it is therefore unnecessary to increase a distance between the sealing material 14 and the inlet 6 or the outlet 13 in order to prevent the sealing material 14 from overlapping with the inlet 6 and the outlet 13. This makes it possible to achieve reduction in size of the electrowetting device 1.

Moreover, according to Embodiment 1, the sealing material 14 is precisely arranged along the opening patterns 12a, 12b, 5a, and 5b, a mark recognition alignment type high precision dispenser is not required, and it is therefore possible to restrain increase of a production cost.

Embodiment 2

Figure 5:
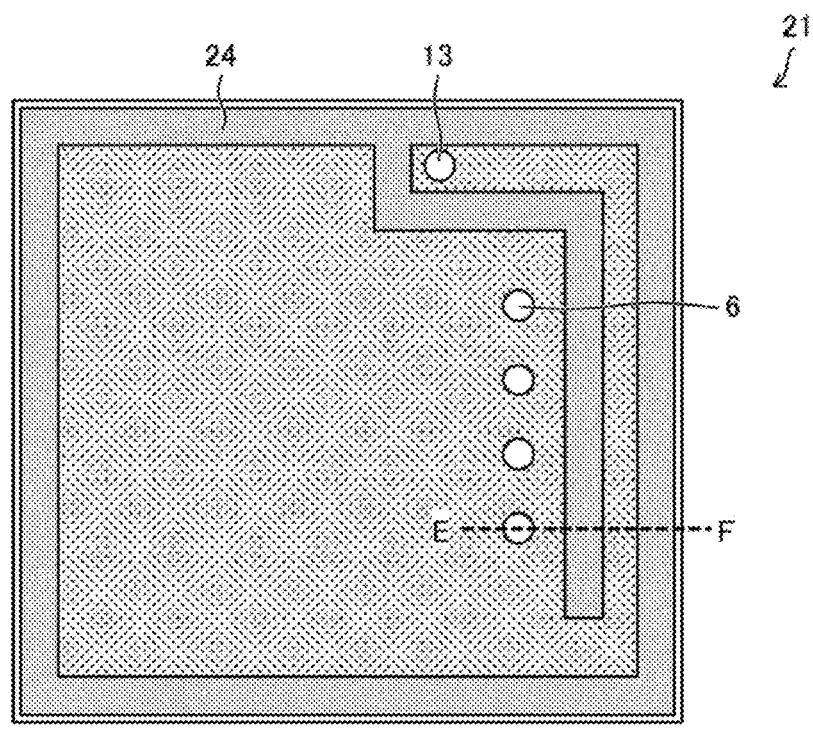
FIG. 5 is a view schematically illustrating a configuration of an electrowetting device in accordance with Embodiment 2 of the disclosure.
Figure 5:
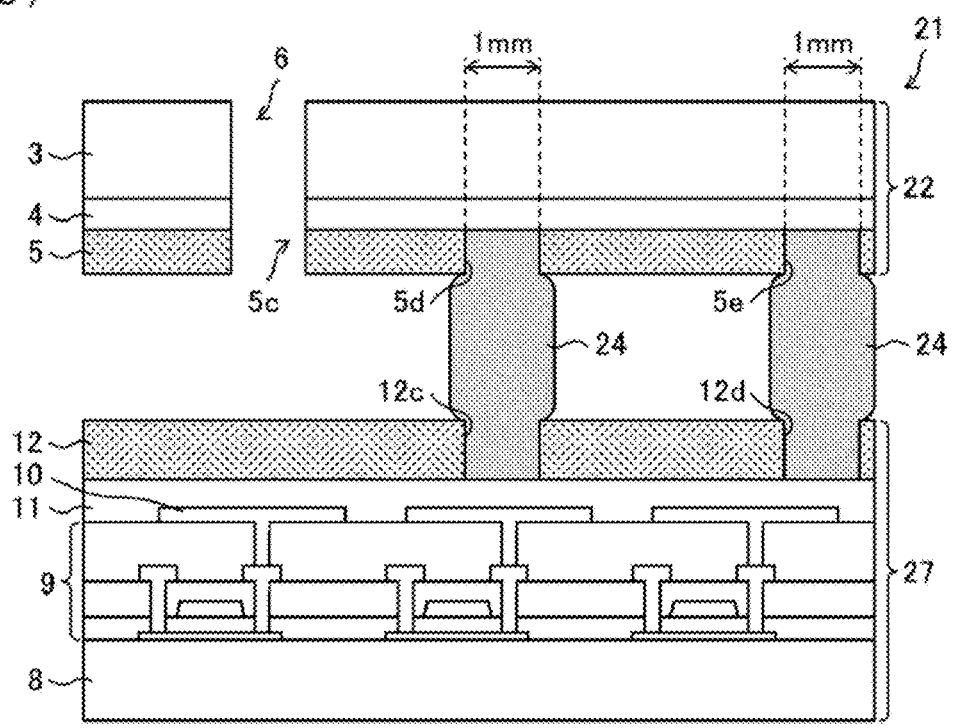

The following description will discuss Embodiment 2 of the disclosure with reference to FIG. 5. Embodiment 2 is different from Embodiment 1 in that each of opening patterns 12c, 12d, 5d, and 5e are formed to have a narrower width, and the other configurations are identical with those described in Embodiment 1. For convenience of explanation, the same reference numerals are given to constituent members having functions identical with those illustrated in the drawings in Embodiment 1, and such constituent members will not be repeatedly described.

(a) of FIG. 5 is a view illustrating the electrowetting device 21 which is seen from the common electrode substrate 22 side and in which substrates have been bonded together with use of the sealing material 24. (b) of FIG. 5 is a cross-sectional view taken along the line E-F in (a) of FIG. 5 and schematically illustrates a configuration of the electrowetting device 21.

As illustrated in (a) of FIG. 5 and (b) of FIG. 5, the second hydrophobic layer 5 in the common electrode substrate 22 in the electrowetting device 21 is provided with opening patterns 5c and 5d each of which has a width of 1 mm, and the first hydrophobic layer 12 in the active substrate 27 in the electrowetting device 21 is also provided with opening patterns 12c and 12d each of which has a width of 1 mm.

The sealing material 24 is arranged along the opening patterns 12c, 12d, 5d, and 5e so as to cover both lateral surfaces of each of the opening patterns 12c, 12d, 5d, and 5e.

According to Embodiment 2, the sealing material 24 can be arranged with further minuteness, and it is therefore possible to achieve further reduction in size of the electrowetting device 21.

Moreover, the opening patterns 12c, 12d, 5d, and 5e are completely filled with the sealing material 24, and it is therefore possible to inhibit decrease in moving speed of a droplet which may be caused in the opening patterns 12c, 12d, 5d, and 5e.

Embodiment 3

Figure 6:
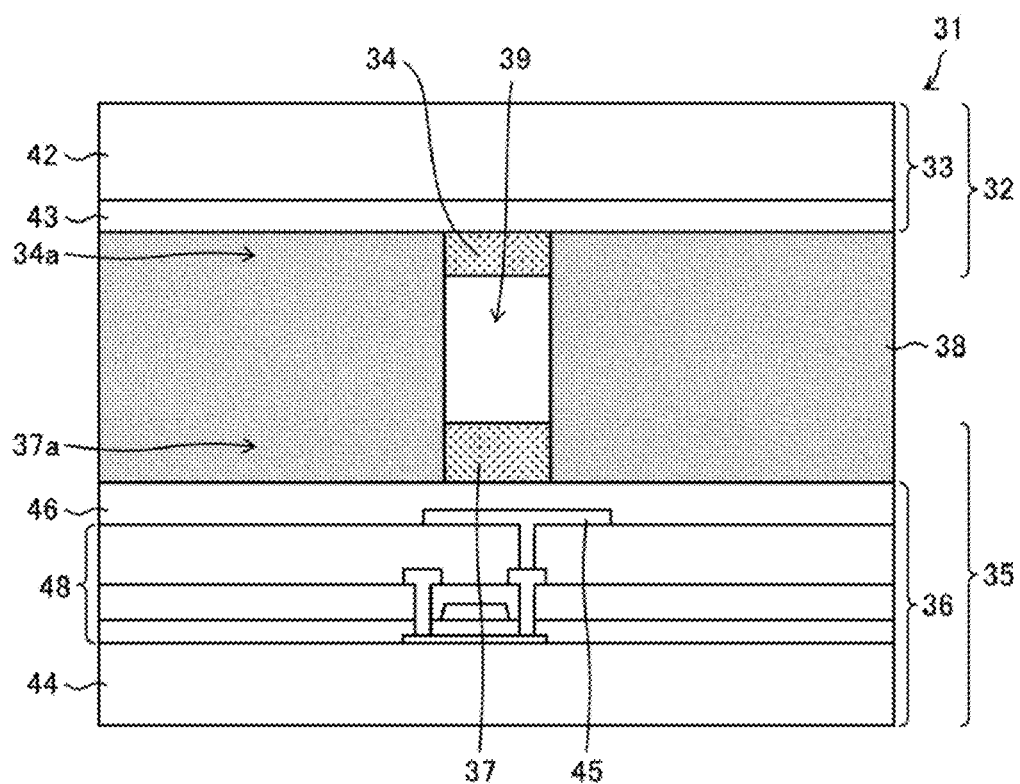
FIG. 6 is a view schematically illustrating a configuration of an electrowetting device in accordance with Embodiment 3 of the disclosure.
Figure 7:
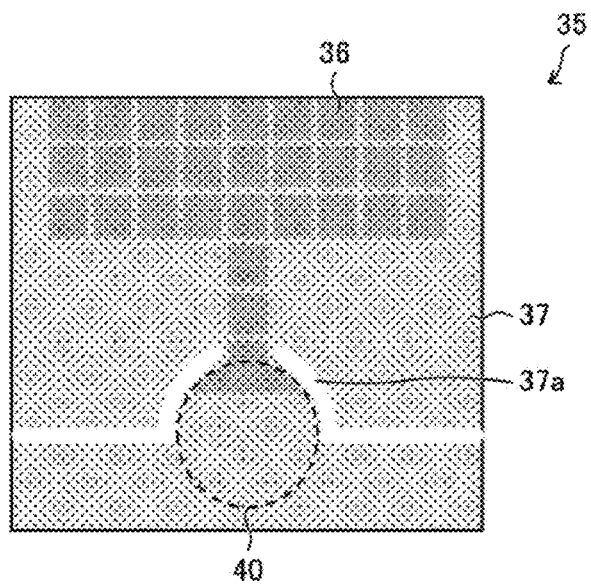
FIG. 7 is a cross-sectional view schematically illustrating a configuration in the vicinity of a droplet feeding region of the electrowetting device in accordance with Embodiment 3 of the disclosure.
Figure 7:
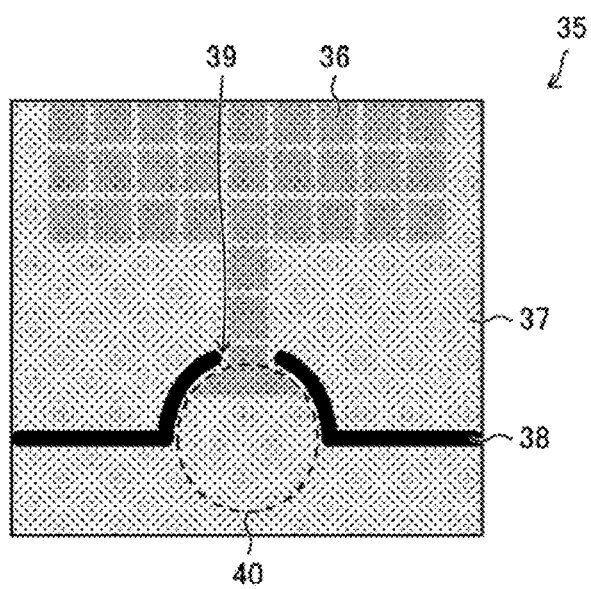
Figure 7:
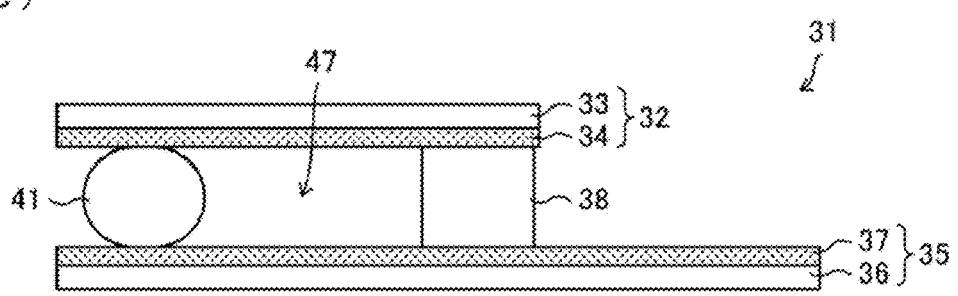
Figure 8:
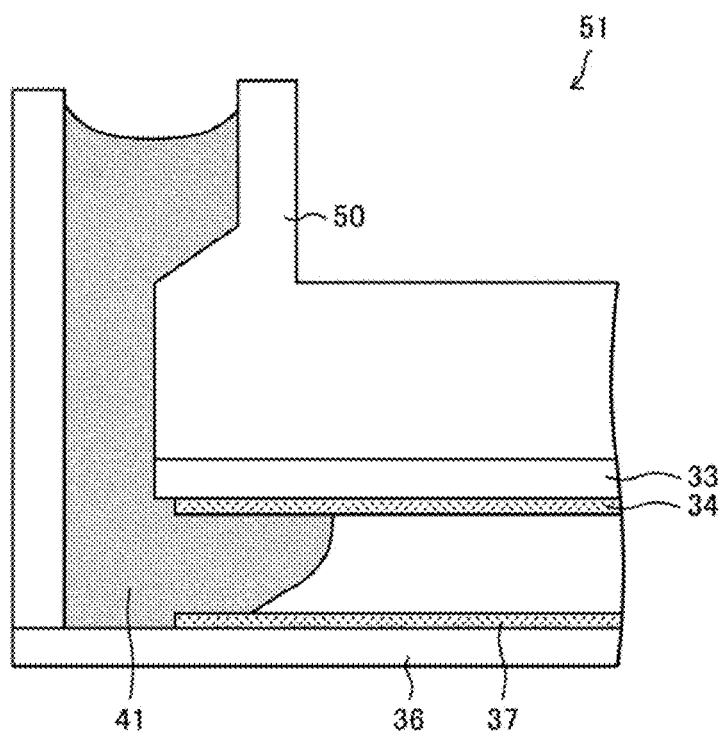
FIG. 8 is a view schematically illustrating a configuration of an electrowetting device including a droplet feeding mechanism.
Figure 9:
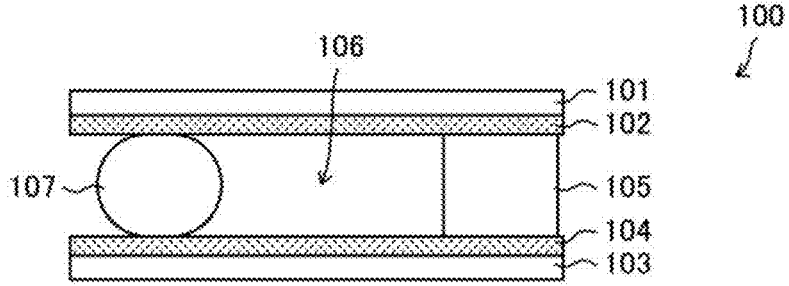
FIG. 9 is a view for explaining a problem of a conventional electrowetting device employing a mechanism in which a droplet is fed from an upper side substrate.
Figure 9:
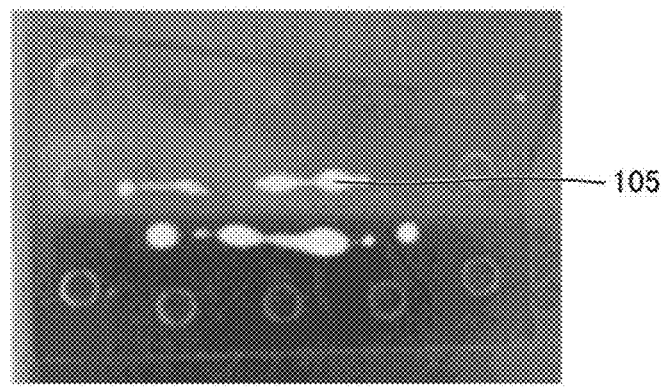
Figure 9:
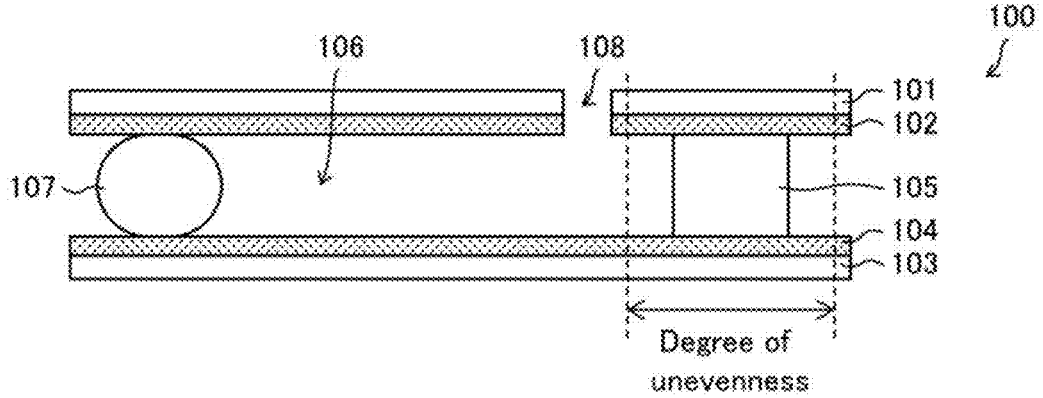

The following description will discuss Embodiment 3 of the disclosure with reference to FIGS. 6 through 8. Embodiment 3 is different from Embodiments 1 and 2 in that a droplet is laterally fed in an electrowetting device 31, and the other configurations are identical with those described in Embodiments 1 and 2. For convenience of explanation, the same reference numerals are given to constituent members having functions identical with those illustrated in the drawings in Embodiments 1 and 2, and such constituent members will not be repeatedly described.

FIG. 6 is a view schematically illustrating a configuration of the electrowetting device 31 employing a mechanism in which a droplet is laterally fed.

As illustrated in FIG. 6, an active substrate 35 includes a first substrate 44, a thin film transistor (TFT) formation layer 48 provided on the first substrate 44, a first electrode layer 45 which is provided on the thin film transistor (TFT) formation layer 48 and constitutes first electrodes which are electrically connected with respective drain electrodes of thin film transistors in the thin film transistor (TFT) formation layer 48, a dielectric layer 46 provided so as to cover the first electrode layer 45, and a first hydrophobic layer 37 which is provided on the dielectric layer 46 and has surface tension smaller than that of the dielectric layer 46.

Note that, here, the first substrate 44, the thin film transistor (TFT) formation layer 48, the first electrode layer 45, and the dielectric layer 46 are collectively referred to as "TFT substrate 36".

Meanwhile, a common electrode substrate 32 includes a second substrate 42, a second electrode layer which is provided on the second substrate 42 and serves as a common electrode layer, and a second hydrophobic layer 34 which has surface tension smaller than that of the second electrode layer 43 and is provided on the second electrode layer 43.

Note that, here, the second substrate 42 and the second electrode layer 43 are collectively referred to as "second electrode substrate 33".

An opening pattern 37a is provided in the first hydrophobic layer 37, an opening pattern 34a is provided in the second hydrophobic layer 34, and a sealing material is arranged along the opening pattern 37a and the opening pattern 34a.

Further, an opening 39 is provided in the sealing material 38 above the first electrode layer 45 which constitutes a first electrode of the active substrate 35. The opening 39 is a break of the sealing material 38 which break is formed in a region in which the opening pattern 37a and the opening pattern 34a are not provided.

(a) of FIG. 7 is a view illustrating the active substrate 35 on which the sealing material 38 has not been provided yet. (b) of FIG. 7 is a view illustrating the active substrate 35 on which the sealing material 38 has been provided. (c) of FIG. 7 is a view schematically illustrating a configuration of the electrowetting device 31 in which the active substrate 35 and the common electrode substrate 32 are bonded together.

As illustrated in (a) of FIG. 7, in the active substrate 35, a droplet feeding region 40 is provided so that a droplet is externally fed, and the opening pattern 37a is provided in the first hydrophobic layer 37 because the opening 39 of the sealing material 38, which serves as a path through which the droplet is fed, needs to be precisely formed above the first electrode layer 45 which constitutes the first electrode in the droplet feeding region 40.

As illustrated in FIG. 6, in Embodiment 3, the opening patterns are provided in both the first hydrophobic layer 37 and the second hydrophobic layer 34, and the opening pattern 37a and the opening pattern 34a are arranged so as to overlap with each other in the plan view. Note, however, that Embodiment 3 is not limited to this, and an opening pattern can be provided in only one of the first hydrophobic layer 37 and the second hydrophobic layer 34, and the opening pattern 37a and the opening pattern 34a can merely partially overlap with each other or do not need to overlap with each other in the plan view, provided that the opening 39 of the sealing material 38 can be provided.

As illustrated in (b) of FIG. 7, the sealing material 38 is arranged along the opening pattern 37a, and thus the opening 39 which is a break of the sealing material 38 is formed in the sealing material 38.

As illustrated in (c) of FIG. 7, in the electrowetting device 31, the active substrate 35 is larger in size than the common electrode substrate 32, and the common electrode substrate 32 and the active substrate 35 are bonded together with the sealing material 38 such that a part of the first hydrophobic layer 37 in the active substrate 35 and the second hydrophobic layer 34 in the common electrode substrate 32 face each other.

That is, in the electrowetting device 31, a flow channel for the droplet 41 is formed by the first hydrophobic layer 37 and the second hydrophobic layer 34 which face each other while taking into consideration a moving speed of the droplet 41 and the like, and an oil 47 is fed inside the flow channel as a nonconductive liquid that is immiscible with the droplet 41.

Note that, in the electrowetting device 31 employing the mechanism in which a droplet is laterally fed, an inlet for feeding a droplet and an outlet for discharging a gas inside the flow channel for the droplet 41 can be formed by providing the opening 39 in the sealing material 38.

FIG. 8 is a view schematically illustrating a configuration of an electrowetting device 51 which includes a droplet feeding mechanism 50 for guiding the droplet 41 to the droplet feeding region.

As illustrated in FIG. 8, in the electrowetting device 51 which includes the droplet feeding mechanism 50 for guiding the droplet 41, which has been fed from above, to the droplet feeding region 40 (see FIG. 7), it is possible to feed the droplet 41 from above, as with the foregoing electrowetting device 1 of Embodiment 1 and the foregoing electrowetting device 21 of Embodiment 2.

In the electrowetting device 31 and the electrowetting device 51, the opening pattern serves as a structural mechanism for controlling expansion of the sealing material 38 and it is therefore possible to form the sealing material 38 with satisfactory precision, and a layer which is to be in contact with the sealing material 38 is the dielectric layer 46 having surface tension greater than that of the first hydrophobic layer 37 or the second electrode layer 43 having surface tension greater than that of the second hydrophobic layer 34 and it is therefore possible to maintain a good adhesive property between the active substrate 35 and the common electrode substrate 32 which are bonded together.

Moreover, according to Embodiment 3, the sealing material 38 is arranged precisely along the opening pattern, and it is therefore possible to precisely form the opening 39 in the sealing material 38.

Moreover, according to Embodiment 3, the sealing material 38 is precisely arranged along the opening pattern, and therefore a mark recognition alignment type high precision dispenser is not required. From this, it is possible to restrain increase of a production cost.

[Recap]

The electrowetting device in accordance with an aspect 1 of the disclosure includes: an active substrate including a first substrate, a first electrode layer provided on the first substrate, a dielectric layer provided so as to cover the first electrode layer, and a first hydrophobic layer which has surface tension smaller than that of the dielectric layer and is provided on the dielectric layer; and a common electrode substrate including a second substrate, a second electrode layer provided on the second substrate, and a second hydrophobic layer which has surface tension smaller than that of the second electrode layer and is provided on the second electrode layer, an opening pattern being provided in at least one of the first hydrophobic layer and the second hydrophobic layer, and the active substrate and the common electrode substrate being bonded together with a sealing material in the opening pattern such that a space is formed between the active substrate and the common electrode substrate and the first hydrophobic layer and the second hydrophobic layer face each other.

According to the configuration, an opening pattern is provided in at least one of the first hydrophobic layer and the second hydrophobic layer and the sealing material is provided in the opening pattern. Therefore, the opening pattern serves as a structural mechanism for controlling expansion of the sealing material, and this makes it possible to form the sealing material with satisfactory precision.

Moreover, according to the configuration, at least one of the layers in contact with the sealing material is the dielectric layer having surface tension greater than that of the first hydrophobic layer or the second electrode layer having surface tension greater than that of the second hydrophobic layer. From this, it is possible to maintain a good adhesive property between the active substrate and the common electrode substrate which are bonded together. That is, it is possible to maintain good peel strength between the active substrate and the common electrode substrate which are bonded together.

According to the electrowetting device in accordance with an aspect 2 of the disclosure, it is possible in the aspect 1 that: the opening pattern is provided in each of the first hydrophobic layer and the second hydrophobic layer; and, in a plan view, a first opening pattern which is the opening pattern provided in the first hydrophobic layer partially overlaps with a second opening pattern which is the opening pattern provided in the second hydrophobic layer.

According to the configuration, it is possible to maintain a better adhesive property between the active substrate and the common electrode substrate which are bonded together.

According to the electrowetting device in accordance with an aspect 3 of the disclosure, it is possible in the aspect 1 that: the opening pattern is provided in each of the first hydrophobic layer and the second hydrophobic layer; and, in a plan view, a first opening pattern which is the opening pattern provided in the first hydrophobic layer overlaps with a second opening pattern which is the opening pattern provided in the second hydrophobic layer.

According to the configuration, it is possible to maintain a better adhesive property between the active substrate and the common electrode substrate which are bonded together.

According to the electrowetting device in accordance with an aspect 4 of the disclosure, it is possible in the aspect 2 that a plurality of through holes are provided in the common electrode substrate; and, in the plan view, the plurality of through holes overlap with the first hydrophobic layer and the second opening pattern.

According to the configuration, it is possible to provide the electrowetting device in which a plurality of through holes are provided in the common electrode substrate.

According to the electrowetting device in accordance with an aspect 5 of the disclosure, it is possible in the aspect 4 that one or some of the plurality of through holes respectively serve as inlets through which droplets are fed into the space.

According to the configuration, it is possible to provide the electrowetting device in which an inlet through which a droplet is fed is provided in the common electrode substrate.

According to the electrowetting device in accordance with an aspect 6 of the disclosure, it is possible in the aspect 5 that at least one of the rest of the plurality of through holes serves as an outlet through which a gas inside the space is discharged.

According to the configuration, it is possible to provide the electrowetting device in which an outlet through which a gas inside the space is discharged is provided in the common electrode substrate.

According to the electrowetting device in accordance with an aspect 7 of the disclosure, it is possible in any of the aspects 1 through 3 that: the active substrate is larger in size than the common electrode substrate; a droplet feeding region for feeding a droplet into the space is provided on the first hydrophobic layer of the active substrate, the droplet feeding region being located in a part in which the active substrate does not overlap with the common electrode substrate in the plan view; the first electrode layer is provided so as to overlap with the droplet feeding region in the plan view; and a part of the first electrode layer which part overlaps with the droplet feeding region in the plan view is free of the opening pattern.

According to the configuration, it is possible to provide the electrowetting device employing a mechanism in which a droplet is laterally fed.

According to the electrowetting device in accordance with an aspect 8 of the disclosure, it is possible in any of the aspects 1 through 7 that the sealing material is provided so as not to make contact with both lateral surfaces of the opening pattern.

According to the configuration, it is possible to provide the electrowetting device in which the sealing material is precisely arranged.

According to the electrowetting device in accordance with an aspect 9 of the disclosure, it is possible in any of the aspects 1 through 7 that the sealing material is provided so as to cover both lateral surfaces of the opening pattern.

According to the configuration, it is possible to provide the electrowetting device which can inhibit decrease in moving speed of a droplet which may be caused in the opening pattern.

According to the electrowetting device in accordance with an aspect 10 of the disclosure, it is possible in any of the aspects 1 through 9 that the sealing material contains an epoxy group.

According to the configuration, it is possible to provide the electrowetting device in which the active substrate and the common electrode substrate can be bonded together by heat treatment.

The electrowetting device in accordance with an aspect 11 of the disclosure can further include, in the aspect 7, a droplet feeding mechanism for guiding a droplet, which has been fed from above, to the droplet feeding region, the droplet feeding mechanism being provided above the droplet feeding region.

According to the configuration, it is possible to provide the electrowetting device in which a droplet can be fed from above.

The method in accordance with an aspect 12 of the disclosure for producing an electrowetting device includes: an active substrate forming step including forming a first electrode layer on a first substrate, forming a dielectric layer which covers the first electrode layer, and forming a first hydrophobic layer, which has surface tension smaller than that of the dielectric layer, on the dielectric layer; a common electrode substrate forming step including forming a second electrode layer on a second substrate, and forming a second hydrophobic layer, which has surface tension smaller than that of the second electrode layer, on the second electrode layer; and a bonding step of bonding the active substrate and the common electrode substrate together with a sealing material such that a space is formed between the active substrate and the common electrode substrate and the first hydrophobic layer and the second hydrophobic layer face each other, at least one of the forming the first hydrophobic layer on the dielectric layer and the forming the second hydrophobic layer on the second electrode layer including an opening pattern forming step of forming an opening pattern in the hydrophobic layer, and in the bonding step, the sealing material being formed in the opening pattern.

According to the method, at least one of the forming the first hydrophobic layer on the dielectric layer and the forming the second hydrophobic layer on the second electrode layer includes the opening pattern forming step of forming an opening pattern in the hydrophobic layer and, in the bonding step, the sealing material is formed in the opening pattern. Therefore, the opening pattern serves as a structural mechanism for controlling expansion of the sealing material, and this makes it possible to form the sealing material with satisfactory precision.

Moreover, according to the method, at least one of the layers in contact with the sealing material is the dielectric layer having surface tension greater than that of the first hydrophobic layer or the second electrode layer having surface tension greater than that of the second hydrophobic layer. From this, it is possible to maintain a good adhesive property between the active substrate and the common electrode substrate which are bonded together. That is, it is possible to maintain good peel strength between the active substrate and the common electrode substrate which are bonded together.

According to the method in accordance with an aspect 13 of the disclosure, it is possible in the aspect 12 that: the opening pattern forming step includes a first step of forming a resist film in a predetermined pattern, a second step of forming the hydrophobic layer so that the hydrophobic layer covers the resist film, and a third step of removing the resist film and also the hydrophobic layer which is provided on the resist film.

According to the method, it is possible to provide the method for producing the electrowetting device in which an opening pattern is formed in the hydrophobic layer with use of the removing step.

According to the method in accordance with an aspect 14 of the disclosure, it is possible in the aspect 12 that: the opening pattern forming step includes a first step of forming the hydrophobic layer, a second step of forming a resist film on the hydrophobic layer in a predetermined pattern, a third step of forming an opening pattern in the hydrophobic layer by carrying out dry etching while using the resist film as a mask, and a forth step of removing the resist film on the hydrophobic layer.

According to the method, it is possible to provide the method for producing the electrowetting device in which an opening pattern is formed in the hydrophobic layer by carrying out dry etching.

[Additional Remarks]

The disclosure is not limited to the embodiments, but can be altered by a skilled person in the art within the scope of the claims. The disclosure also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The disclosure is applicable to an electrowetting device and a method for producing the electrowetting device.

REFERENCE SIGNS LIST

1: Electrowetting device
2: Common electrode substrate
3: Second substrate
4: Second electrode layer
5: Second hydrophobic layer
5a: Opening pattern (second opening pattern)
5b: Opening pattern (second opening pattern)
5c: Opening pattern
5d: Opening pattern (second opening pattern)
5e: Opening pattern (second opening pattern)
6: Inlet (through hole)
7: Active substrate
8: First substrate
10: First electrode layer
11: Dielectric layer
12: First hydrophobic layer
12a: Opening pattern (first opening pattern)
12b: Opening pattern (first opening pattern)
12c: Opening pattern (first opening pattern)
12d: Opening pattern (first opening pattern)
13: Outlet (through hole)
14: Sealing material
15: Resist film
16: Mask
17: Removing solution
21: Electrowetting device
22: Common electrode substrate
24: Sealing material
25: Resist film
26: Mask
27: Active substrate
32: Common electrode substrate
34: Second hydrophobic layer
34a: Opening pattern (second opening pattern)

35: Active substrate
37: First hydrophobic layer
37a: Opening pattern (first opening pattern)
38: Sealing material
39: Opening
41: Droplet
42: Second substrate
43: Second electrode layer
44: First substrate
45: First electrode layer
46: Dielectric layer
50: Droplet feeding mechanism
51: Electrowetting device

The invention claimed is:

1. An electrowetting device, comprising:
an active substrate including a first substrate, a first electrode layer provided on the first substrate, a dielectric layer provided so as to cover the first electrode layer, and a first hydrophobic layer which has surface tension smaller than that of the dielectric layer and is provided on the dielectric layer; and
a common electrode substrate including a second substrate, a second electrode layer provided on the second substrate, and a second hydrophobic layer which has surface tension smaller than that of the second electrode layer and is provided on the second electrode layer,
a plurality of through holes being provided in the common electrode substrate,
the first hydrophobic layer being provided with an outer first opening pattern and an inner first opening pattern, the outer first opening pattern having a frame-like shape, and the inner first opening pattern being provided on an inner side of the outer first opening pattern,
the first hydrophobic layer having a first region and a second region which are partially separated from each other by the inner first opening pattern,
the second hydrophobic layer having an outer second opening pattern, an inner second opening pattern, and through-hole second opening patterns, the outer second opening pattern having a frame-like shape, the inner second opening pattern being provided on an inner side of the outer second opening pattern, and the through-hole second opening patterns being provided so as to overlap with the respective plurality of through holes in a plan view,
the second hydrophobic layer having a third region and a fourth region which are partially separated from each other by the inner second opening pattern,
the outer first opening pattern overlapping with the outer second opening pattern in the plan view,
the inner first opening pattern overlapping with the inner second opening pattern in the plan view, and
the active substrate and the common electrode substrate being bonded together with a sealing material in the outer first opening pattern, the inner first opening pattern, the outer second opening pattern, and the inner second opening pattern such that a space is formed between the active substrate and the common electrode substrate and the first hydrophobic layer and the second hydrophobic layer face each other.

2. The electrowetting device as set forth in claim 1, wherein one or some of the plurality of through holes respectively serve as inlets through which droplets are fed into the space.

3. The electrowetting device as set forth in claim 2, wherein the one or some of the plurality of through holes respectively serving as the inlets overlap with the first region in the plan view.

4. The electrowetting device as set forth in claim 2, wherein at least one of the rest of the plurality of through holes serves as an outlet through which a gas inside the space is discharged.

5. The electrowetting device as set forth in claim 4, wherein the at least one of the rest of the plurality of through holes serving as the outlet overlaps with the second region in the plan view.

6. The electrowetting device as set forth in claim 1, wherein the sealing material is provided so as not to make contact with both lateral surfaces of each of the outer first opening pattern, the inner first opening pattern, the outer second opening pattern, and the inner second opening pattern.

7. The electrowetting device as set forth in claim 1, wherein the sealing material is provided so as to cover both lateral surfaces of each of the outer first opening pattern, the inner first opening pattern, the outer second opening pattern, and the inner second opening pattern.

8. The electrowetting device as set forth in claim 7, wherein:
the sealing material covers a part of a surface of the first hydrophobic layer which surface faces the second hydrophobic layer; and
the sealing material covers a part of a surface of the second hydrophobic layer which surface faces the first hydrophobic layer.

9. The electrowetting device as set forth in claim 1, wherein the sealing material contains an epoxy group.

10. The electrowetting device as set forth in claim 1, wherein:
one end of the inner first opening pattern is connected to the outer first opening pattern; and
one end of the inner second opening pattern is connected to the outer second opening pattern.

11. The electrowetting device as set forth in claim 1, wherein:
one or some of the plurality of through holes respectively serve as inlets through which droplets are fed into the space;
at least one of the rest of the plurality of through holes serves as an outlet through which a gas inside the space is discharged;
the one or some of the plurality of through holes respectively serving as the inlets overlap with the first region in a plan view; and
the at least one of the rest of the plurality of through holes serving as the outlet overlaps with the second region in the plan view.

12. A method for producing an electrowetting device, said method comprising:
an active substrate forming step including forming a first electrode layer on a first substrate, forming a dielectric layer which covers the first electrode layer, and forming a first hydrophobic layer, which has surface tension smaller than that of the dielectric layer, on the dielectric layer;
a common electrode substrate forming step including forming a second electrode layer on a second substrate, and forming a second hydrophobic layer, which has surface tension smaller than that of the second electrode layer, on the second electrode layer; and a bonding step of bonding the active substrate and the common electrode substrate together with a sealing material such that a space is formed between the active substrate and the common electrode substrate and the first hydrophobic layer and the second hydrophobic layer face each other, in the common electrode substrate forming step, a plurality of through holes being formed in the common electrode substrate, in the step of forming the first hydrophobic layer, an outer first opening pattern, an inner first opening pattern, a first region, and a second region being formed in the first hydrophobic layer, the outer first opening pattern having a frame-like shape, the inner first opening pattern being formed on an inner side of the outer first opening pattern, the first region and the second region being partially separated from each other by the inner first opening pattern, in the step of forming the second hydrophobic layer, an outer second opening pattern, an inner second opening pattern, through-hole second opening patterns, a third region, and a fourth region being formed in the second hydrophobic layer, the outer second opening pattern having a frame-like shape, the inner second opening pattern being formed on an inner side of the outer second opening pattern, the through-hole second opening patterns being formed so as to overlap with the respective plurality of through holes in a plan view, the third region and the fourth region being partially separated from each other by the inner second opening pattern, the outer first opening pattern overlapping with the outer second opening pattern in the plan view, the inner first opening pattern overlapping with the inner second opening pattern in the plan view, and in the bonding step, the sealing material being formed in the outer first opening pattern, the inner first opening pattern, the outer second opening pattern, and the inner second opening pattern.

13. The method as set forth in claim 12, wherein:

the step of forming the first hydrophobic layer includes a first step of forming a resist film in a predetermined pattern, a second step of forming the first hydrophobic layer so that the first hydrophobic layer covers the resist film, and a third step of removing the resist film and also the first hydrophobic layer which is provided on the resist film; and the step of forming the second hydrophobic layer includes a fourth step of forming a resist film in a predetermined pattern, a fifth step of forming the second hydrophobic layer so that the second hydrophobic layer covers the resist film, and a sixth step of removing the resist film and also the second hydrophobic layer which is provided on the resist film.

14. The method as set forth in claim 12, wherein:

the step of forming the first hydrophobic layer includes a first step of forming the first hydrophobic layer, a second step of forming a resist film on the first hydrophobic layer in a predetermined pattern, a third step of forming the outer first opening pattern and the inner first opening pattern in the first hydrophobic layer by carrying out dry etching while using the resist film as a mask, and a fourth step of removing the resist film on the first hydrophobic layer; and the step of forming the second hydrophobic layer includes a fifth step of forming the second hydrophobic layer, a sixth step of forming a resist film on the second hydrophobic layer in a predetermined pattern, a seventh step of forming the outer second opening pattern, the inner second opening pattern, and the through-hole second opening patterns in the second hydrophobic layer by carrying out dry etching while using the resist film as a mask, and an eighth step of removing the resist film on the second hydrophobic layer.

* * * * *